(12) United States Patent
 Koshimizu

(10) Patent No.: US 12,700,575 B2
(45) Date of Patent: Aug. 4, 2026

(54) PLASMA PROCESSING APPARATUS AND PLASMA PROCESSING METHOD

(71) Applicant: Tokyo Electron Limited, Tokyo (JP)

(72) Inventor: Chishio Koshimizu, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 975 days.

(21) Appl. No.: 17/483,866

(22) Filed: Sep. 24, 2021

(65) Prior Publication Data

US 2022/0108878 A1 Apr. 7, 2022

(30) Foreign Application Priority Data

Oct. 6, 2020 (JP) ................................. 2020-169036

(51) Int. Cl.
 H01J 37/32 (2006.01)
(52) U.S. Cl.
 CPC . H01J 37/32715 (2013.01); H01J 2237/2007 (2013.01); H01J 2237/334 (2013.01)
(58) Field of Classification Search
 CPC ......... H01J 37/32715; H01J 2237/2007; H01J 2237/334; H01J 37/32082; H01J 37/32477; H01J 37/32532; H01J 37/32174; H01J 37/32642; H01L 21/3065; H01L 21/6831
 USPC .................................................... 156/345.47
 See application file for complete search history.

(56) References Cited

U.S. PATENT DOCUMENTS

| | | | | |
|---|---|---|---|---|
| 6,187,685 B1 * | 2/2001 | Hopkins | ........... | H01L 21/30655 |
| | | | | 438/719 |
| 2006/0196605 A1 | 9/2006 | Ikegami et al. | | |

| | | | |
|---|---|---|---|
| 2008/0236492 A1 | 10/2008 | Yamazawa | |
| 2009/0026170 A1 | 1/2009 | Tanaka et al. | |
| 2011/0253672 A1 | 10/2011 | Kamibayashi et al. | |
| 2018/0204757 A1 | 7/2018 | Fushimi | |
| 2018/0366305 A1 * | 12/2018 | Nagami ............ | H01J 37/32165 |
| 2019/0088520 A1 | 3/2019 | Kraus et al. | |
| 2020/0135527 A1 | 4/2020 | Sung et al. | |
| 2020/0185193 A1 | 6/2020 | Koshimizu | |
| 2020/0219701 A1 | 7/2020 | Koshimizu | |
| 2021/0074524 A1 | 3/2021 | Koshimizu | |
| 2021/0305025 A1 | 9/2021 | Tamura et al. | |

(Continued)

FOREIGN PATENT DOCUMENTS

JP 2019-036658 A 3/2019

OTHER PUBLICATIONS

Fundamentals of Physics, David Halliday, Robert Resnick, Jearl Walker 1997.*

(Continued)

*Primary Examiner* — Ram N Kackar

(74) *Attorney, Agent, or Firm* — Studebaker Brackett PLLC

(57) ABSTRACT

A disclosed plasma processing method includes a direct-current power source configured to generate a negative direct-current voltage. A bias electrode of a substrate support provided in the chamber is alternately connected to the direct-current power source and the ground. A time until a potential of the bias electrode reaches a ground potential after the bias electrode is connected to the ground is set to be longer than a time until the potential of the bias electrode reaches the negative direct-current voltage after the direct-current power source is connected to the bias electrode.

14 Claims, 7 Drawing Sheets

(56)  References Cited

U.S. PATENT DOCUMENTS

| | | | |
|---|---|---|---|
| 2022/0037121 A1* | 2/2022 | Dorf | ................. H01J 37/32174 |
| 2022/0108878 A1 | 4/2022 | Koshimizu | |
| 2022/0384150 A1 | 12/2022 | Koshimizu | |
| 2023/0050506 A1 | 2/2023 | Koshimizu | |

OTHER PUBLICATIONS

Chishio Koshimizu, U.S. Appl. No. 17/483,866, filed Mar. 3, 2021, which corresponds to U.S. Appl. No. 17/483,866.

* cited by examiner

PLASMA PROCESSING APPARATUS AND PLASMA PROCESSING METHOD

CROSS-REFERENCE TO RELATED APPLICATIONS

This application is based on and claims the benefit of priority from Japanese Patent Application No. 2020-169036 filed on Oct. 6, 2020, the entire contents of which are incorporated herein by reference.

FIELD

Exemplary embodiments of the present disclosure relate to a plasma processing apparatus and a plasma processing method.

BACKGROUND

A plasma processing apparatus is used in plasma processing on a substrate. The plasma processing apparatus has a chamber and a substrate support. The substrate support has a lower electrode and an electrostatic chuck. The electrostatic chuck is provided on the lower electrode. The substrate support supports an edge ring. The substrate is placed in a region surrounded by the edge ring on the substrate support. Bias power is supplied to the lower electrode in order to draw ions from plasma into the substrate. Japanese Unexamined Patent Publication No. 2019-36658 discloses such a plasma processing apparatus.

SUMMARY

In an exemplary embodiment, a plasma processing apparatus is provided. The plasma processing apparatus is provided with a chamber, a plasma generator, a substrate support, a direct-current power source, a first switch, an adjustor, and a controller. The plasma generator is configured to generate plasma from a gas in the chamber. The substrate support has a bias electrode and is provided in the chamber. The direct-current power source is configured to generate a negative direct-current voltage. The first switch is connected between the direct-current power source and the bias electrode. The adjustor has at least one second switch connected between a ground and the bias electrode. The controller is configured to control the first switch and the at least one second switch to alternately connect the direct-current power source and the ground to the bias electrode. The adjustor is configured to make a time until a potential of the bias electrode reaches a ground potential after the bias electrode is connected to the ground longer than a time until the potential of the bias electrode reaches the negative direct-current voltage after the direct-current power source is connected to the bias electrode.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
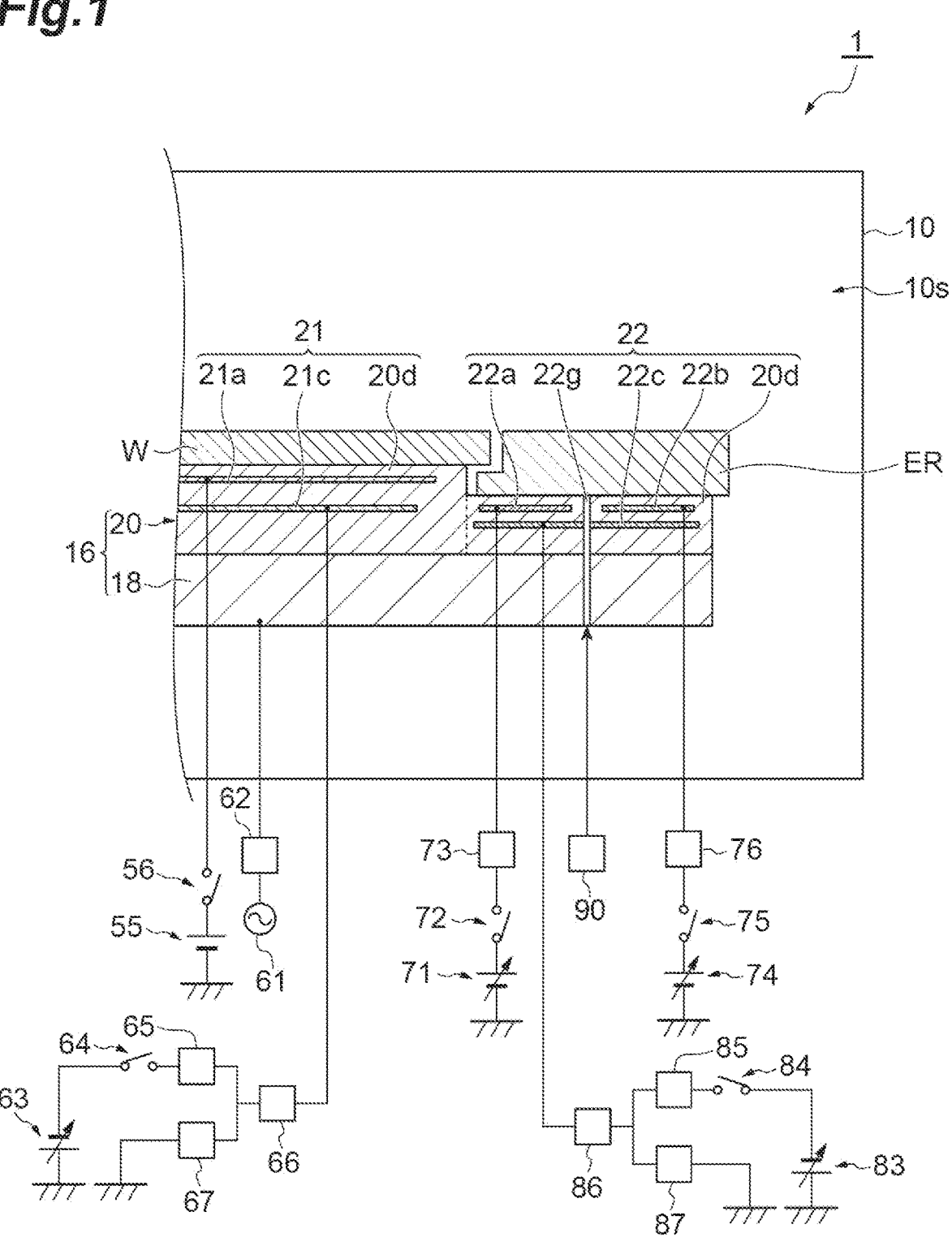
FIG. 1 schematically illustrates a plasma processing apparatus according to an exemplary embodiment.

Hereinafter, various exemplary embodiments will be described.

In an exemplary embodiment, a plasma processing apparatus is provided. The plasma processing apparatus is provided with a chamber, a plasma generator, a substrate support, a direct-current power source, a first switch, an adjustor, and a controller. The plasma generator is configured to generate plasma from a gas in the chamber. The substrate support has a bias electrode and is provided in the chamber. The direct-current power source is configured to generate a negative direct-current voltage. The first switch is connected between the direct-current power source and the bias electrode. The adjustor has at least one second switch connected between a ground and the bias electrode. The controller is configured to control the first switch and the at least one second switch to alternately connect the direct-current power source and the ground to the bias electrode. The adjustor is configured to make a time until a potential of the bias electrode reaches a ground potential after the bias electrode is connected to the ground longer than a time until the potential of the bias electrode reaches the negative direct-current voltage after the direct-current power source is connected to the bias electrode.

According to the above embodiment, since the time until the potential of the bias electrode reaches the ground potential after the bias electrode is connected to the ground is long, the amount of overshoot to the positive side of the potential of the substrate after the bias electrode is connected to the ground is reduced. Therefore, a rise in the potential of the plasma after the bias electrode is connected to the ground is suppressed. Accordingly, a potential difference between the plasma and the wall of the chamber is reduced, and thus the energy of ions toward the wall of the chamber is reduced.

In an exemplary embodiment, the adjustor may further have a circuit element connected between the bias electrode and the ground. The circuit element extends the time until the potential of the bias electrode reaches the ground potential after the bias electrode is connected to the ground. In an exemplary embodiment, the circuit element may include an inductor, a resistor, or a capacitor.

In an exemplary embodiment, the plasma processing apparatus may be further provided with an other circuit element connected between the direct-current power source and the bias electrode. In the embodiment, the circuit constant of the circuit element of the adjustor is larger than a circuit constant of the other circuit element. In an exemplary embodiment, the other circuit element may include an inductor, a resistor, or a capacitor.

In an exemplary embodiment, the controller may be configured to control the at least one second switch to intermittently connect the bias electrode to the ground until the potential of the bias electrode reaches the ground potential after the bias electrode is connected to the ground.

In an exemplary embodiment, the adjustor may have a plurality of second switches connected in parallel between the ground and the bias electrode, as the at least one second switch. The controller is configured to intermittently and sequentially close the plurality of second switches until the potential of the bias electrode reaches the ground potential after the bias electrode is connected to the ground.

In an exemplary embodiment, the substrate support may further have a dielectric portion formed of a dielectric. The bias electrode may be provided in the dielectric portion. In an exemplary embodiment, the dielectric portion may configure an electrostatic chuck.

In an exemplary embodiment, the substrate support may have a first region on which a substrate is placed, and a second region on which an edge ring is placed. The bias electrode is provided in the dielectric portion in the first region. The substrate support may further have an other bias electrode. The other bias electrode is provided in the dielectric portion in the second region. The plasma processing apparatus may be further provided with an other direct-current power source, a third switch, and an other adjustor. The other direct-current power source is configured to generate a negative direct-current voltage. The third switch is connected between the other direct-current power source and the other bias electrode. The other adjustor has at least one fourth switch connected between the ground and the other bias electrode. The controller is configured to control the third switch and the at least one fourth switch to alternately connect the other direct-current power source and the ground to the other bias electrode. The other adjustor is configured to make a time until a potential of the other bias electrode reaches the ground potential after the other bias electrode is connected to the ground longer than a time until the potential of the other bias electrode reaches the negative direct-current voltage after the other direct-current power source is connected to the other bias electrode.

In an exemplary embodiment, the substrate support may have a lower electrode which is the bias electrode, and an electrostatic chuck provided on the lower electrode.

In another exemplary embodiment, a plasma processing method is provided. The plasma processing method includes (a) preparing a substrate on a substrate support in a chamber of a plasma processing apparatus. The plasma processing method further includes (b) generating plasma in the chamber. The plasma processing method further includes (c) alternately connecting a bias electrode of the substrate support to a direct-current power source and a ground. The direct-current power source is configured to generate a negative direct-current voltage. In the operation (c), a time until a potential of the bias electrode reaches a ground potential after the bias electrode is connected to the ground is set to be longer than a time until the potential of the bias electrode reaches the negative direct-current voltage after the direct-current power source is connected to the bias electrode.

Hereinafter, various exemplary embodiments will be described in detail with reference to the drawings. In the drawings, the same or equivalent portions are denoted by the same reference symbols.

Figure 2:
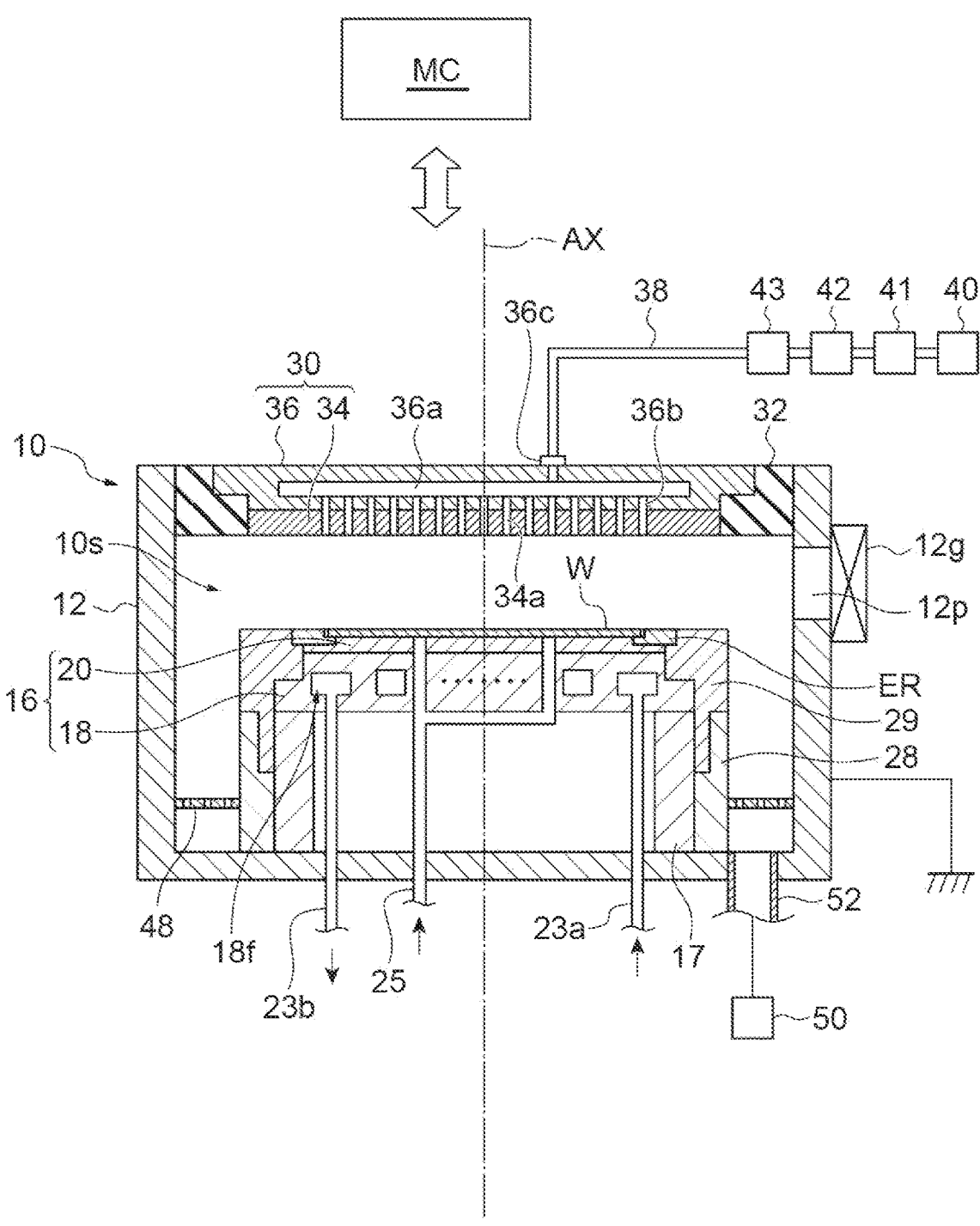
FIG. 2 illustrates in detail a configuration in a chamber of the plasma processing apparatus according to an exemplary embodiment.

FIG. 1 is a diagram schematically showing a plasma processing apparatus according to an exemplary embodiment. A plasma processing apparatus 1 shown in FIG. 1 is provided with a chamber 10. FIG. 2 is a diagram showing in detail a configuration in the chamber of the plasma processing apparatus according to an exemplary embodiment. As shown in FIG. 2, the plasma processing apparatus 1 is a capacitively coupled plasma processing apparatus.

The chamber 10 provides an internal space 10s therein. The central axis of the internal space 10s is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. This film may be a film formed by anodization or a ceramic film such as a film formed of yttrium oxide.

A side wall of the chamber body 12 provides a passage 12p. A substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate support 16 may be supported by a support 17. The support 17 extends upward from a bottom portion of the chamber body 12. The support 17 has a substantially cylindrical shape. The support 17 is formed of an insulating material such as quartz.

The substrate support 16 may further have a base 18 and an electrostatic chuck 20. The base 18 and the electrostatic chuck 20 are provided in the chamber 10. The base 18 is formed of a conductive material such as aluminum and has a substantially disk shape.

The base 18 provides a flow path 18f in the interior thereof. The flow path 18f is a flow path for a heat exchange medium. The heat exchange medium is, for example, a liquid refrigerant. The flow path 18f receives a heat exchange medium from a supply device (for example, a chiller unit). The supply device is provided outside the chamber 10. The heat exchange medium flows through the flow path 18f and is then returned to the supply device through a pipe 23b.

The electrostatic chuck 20 is provided on the base 18. The substrate W is placed on the electrostatic chuck 20 and held by the electrostatic chuck 20 when it is processed in the internal space 10s. The substrate support 16 may support an edge ring ER that is mounted thereon. The edge ring ER is a plate having a substantially annular shape. The edge ring ER has electrical conductivity. The edge ring ER is formed of, for example, silicon or silicon carbide. The edge ring ER is mounted on the substrate support 16 such that the central axis thereof coincides with the axis AX. The substrate W accommodated in the chamber 10 is disposed on the electrostatic chuck 20 and in a region surrounded by the edge ring ER.

The plasma processing apparatus 1 may be provided with a gas supply line 25. The gas supply line 25 supplies a heat transfer gas, for example, a He gas, from a gas supply mechanism to a gap between the upper surface of the electrostatic chuck 20 (a first region to be described later) and the rear surface (lower surface) of the substrate W.

The plasma processing apparatus 1 may be further provided with an outer peripheral portion 28 and an outer peripheral portion 29. The outer peripheral portion 28 extends upward from the bottom portion of the chamber body 12. The outer peripheral portion 28 has a substantially cylindrical shape and extends along the outer periphery of the support 17. The outer peripheral portion 28 is formed of a conductive material and has a substantially cylindrical shape. The outer peripheral portion 28 is electrically grounded. A film having plasma resistance is formed on the surface of the outer peripheral portion 28. This film may be a film formed by anodization or a ceramic film such as a film formed of yttrium oxide.

The outer peripheral portion 29 is provided on the outer peripheral portion 28. The outer peripheral portion 29 is formed of a material having insulation properties. The outer peripheral portion 29 is formed of ceramic such as quartz, for example. The outer peripheral portion 29 has a substantially cylindrical shape. The outer peripheral portion 29 extends along the outer peripheries of the base 18 and the electrostatic chuck 20.

The plasma processing apparatus 1 is further provided with an upper electrode 30. The upper electrode 30 is provided above the substrate support 16. The upper electrode 30 closes an upper opening of the chamber body 12 together with a member 32. The member 32 has insulation properties. The upper electrode 30 is supported on an upper portion of the chamber body 12 through the member 32.

The upper electrode 30 includes a ceiling plate 34 and a support 36. The lower surface of the ceiling plate 34 defines the internal space 10s. A plurality of gas holes 34a are provided in the ceiling plate 34. Each of the plurality of gas holes 34a penetrates the ceiling plate 34 in the plate thickness direction (the vertical direction) and is open toward the internal space 10s. The ceiling plate 34 is formed of, for example, silicon. Alternatively, the ceiling plate 34 may have a structure in which a plasma-resistant film is provided on the surface of a member made of aluminum. This film may be a film formed by anodization or a ceramic film such as a film formed of yttrium oxide.

The support 36 detachably supports the ceiling plate 34. The support 36 is formed of a conductive material such as aluminum, for example. The support 36 provides a gas diffusion chamber 36a in the interior thereof. The support 36 is further provided with a plurality of gas holes 36b. The plurality of gas holes 36b extend downward from the gas diffusion chamber 36a. The plurality of gas holes 36b communicate with the plurality of gas holes 34a, respectively. The support 36 is further provided with a gas introduction port 36c. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply gases from one or more gas sources selected from the plurality of gas sources of the gas source group 40 to the internal space 10s at individually adjusted flow rates.

The plasma processing apparatus 1 may be further provided with a baffle plate 48. The baffle plate 48 is provided between the outer peripheral portion 28 and the side wall of the chamber body 12. The baffle plate 48 may be configured, for example, by coating a member made of aluminum with ceramic such as yttrium oxide. A plurality of through-holes are provided in the baffle plate 48. An exhaust pipe 52 is connected to the bottom portion of the chamber body 12 below the baffle plate 48. An exhaust device 50 is connected to the exhaust pipe 52. The exhaust device 50 has a pressure controller such as an automatic pressure control valve, and a vacuum pump such as a turbo molecular pump, and is capable of reducing the pressure in the internal space 10s.

Hereinafter, the substrate support 16 will be described in detail. As described above, the substrate support 16 has the base 18 and the electrostatic chuck 20. As shown in FIG. 1, a radio frequency power source 61 is connected to the base 18 through a matcher 62. The base 18 configures a lower electrode. The radio frequency power source 61 does not need to be electrically connected to the base 18, and may be connected to the upper electrode 30 through the matcher 62.

The radio frequency power source 61 is a power source that generates radio frequency power for plasma generation. That is, the radio frequency power source 61 configures a plasma generator in an embodiment. The radio frequency power that is generated by the radio frequency power source 61 has a frequency in the range of 27 to 100 MHz, for example, a frequency of 40 MHz or 60 MHz. The radio frequency power from the radio frequency power source 61 is supplied to the base 18 through the matcher 62. The radio frequency power source 61 may supply a continuous wave of radio frequency power. Alternatively, the radio frequency power source 61 may supply a pulse of radio frequency power. The pulse of the radio frequency power may be supplied once or more within a bias cycle to be described later. The matcher 62 has a matching circuit. The matching circuit of the matcher 62 has variable impedance. The impedance of the matching circuit of the matcher 62 is adjusted to reduce the reflection from the load of the radio frequency power source 61.

In the plasma processing apparatus 1, when the radio frequency power is supplied from the radio frequency power source 61, a gas is excited in the chamber 10 and plasma is generated from the gas. The substrate W is processed with chemical species such as ions and/or radicals from the generated plasma. For example, the substrate W is etched.

In an embodiment, the substrate support 16 has a dielectric portion 20d. The dielectric portion 20d is formed of a dielectric such as aluminum nitride or aluminum oxide. The dielectric portion 20d has a substantially disk shape. The dielectric portion 20d is provided on the base 18. In an embodiment, the dielectric portion 20d configures the electrostatic chuck 20.

In an embodiment, the substrate support 16 has a first region 21 and a second region 22. The first region 21 and the second region 22 are provided by the electrostatic chuck 20. In FIG. 1, the boundary between the first region 21 and the second region 22 is indicated by a broken line. The first region 21 and the second region 22 may be separated from each other.

The first region 21 is configured to support the substrate W that is placed thereon (that is, on the upper surface thereof). The first region 21 is a region having a disk shape. The central axis of the first region 21 substantially coincides with the axis AX. The first region 21 includes a portion (a central portion) of the dielectric portion 20d. In an embodiment, the thickness of the dielectric portion 20d in the second region 22 may be smaller than the thickness of the dielectric portion 20d in the first region 21. The position in the vertical direction of the upper surface of the dielectric portion 20d in the second region 22 may be lower than the position in the vertical direction of the upper surface of the dielectric portion 20d in the first region 21.

The first region 21 has an electrode 21a (a chuck electrode). The electrode 21a is an electrode having a film shape, and is provided in the dielectric portion 20d in the first region 21. A direct-current power source 55 is connected to the electrode 21a through a switch 56. In addition to the switch 56, a filter that reduces or cuts off radio frequency power may be connected between the electrode 21a and the direct-current power source 55. When the direct-current voltage from the direct-current power source 55 is applied to the electrode 21a, an electrostatic attraction force is generated between the first region 21 and the substrate W. Due to the generated electrostatic attraction force, the substrate W is attracted to the first region 21 and held by the first region 21.

The first region 21 may further have an electrode 21c. The electrode 21c is an electrode having a film shape, and is provided in the dielectric portion 20d in the first region 21. The electrode 21c configures a bias electrode. The electrode 21a may extend closer to the upper surface of the first region 21 than the electrode 21c in the vertical direction.

The plasma processing apparatus 1 is further provided with a direct-current power source 63. The direct-current power source 63 is configured to generate a negative direct-current voltage and apply the negative direct-current voltage to the electrode 21c. The plasma processing apparatus 1 is further provided with a switch 64 (a first switch). The switch 64 is connected between the direct-current power source 63 and the electrode 21c. The plasma processing apparatus 1 may be further provided with an adjustor 65 and a filter 66. The adjustor 65 and the filter 66 are connected between the direct-current power source 63 and the electrode 21c. The adjustor 65 and the filter 66 may be connected between the switch 64 and the electrode 21c.

The second region 22 is provided to surround the first region 21. The second region 22 is a substantially annular region. The central axis of the second region 22 substantially coincides with the axis AX. The second region 22 is configured to support the edge ring ER that is placed thereon (that is, on the upper surface thereof). The second region 22 includes another portion (a peripheral portion) of the dielectric portion 20d.

The second region 22 has an electrode 22a and an electrode 22b. The electrode 22a and the electrode 22b configure a bipolar electrode. Each of the electrode 22a and the electrode 22b is an electrode having a film shape. The electrode 22a and the electrode 22b are provided in the dielectric portion 20d in the second region 22.

A direct-current power source 71 is connected to the electrode 22a through a switch 72 and a filter 73. The filter 73 is an electric filter that cuts off or reduces radio frequency power. The filter 73 prevents radio frequency power from flowing into the direct-current power source 71, or reduces radio frequency power flowing into the direct-current power source 71.

A direct-current power source 74 is connected to the electrode 22b through a switch 75 and a filter 76. The filter 76 is an electric filter that cuts off or reduces radio frequency power. The filter 76 prevents radio frequency power from flowing into the direct-current power source 74, or reduces radio frequency power flowing into the direct-current power source 74.

The direct-current power source 71 and the direct-current power source 74 apply a direct-current voltage to the electrode 22a and the electrode 22b, respectively. The setting potential of each of the electrode 22a and the electrode 22b may be any of a positive potential, a negative potential, and 0 V. For example, the potential of the electrode 22a may be set to a positive potential, and the potential of the electrode 22b may be set to a negative potential. Further, the potential difference between the electrode 22a and the electrode 22b may be formed by using a single direct-current power source instead of two direct-current power sources.

For example, when a potential difference is applied between the electrode 22a and the electrode 22b, an electrostatic attraction force is generated between the second region 22 and the edge ring ER, and the second region 22 functions as a bipolar type electrostatic chuck. Therefore, the second region 22 can hold the edge ring ER even if plasma is not generated. The edge ring ER is attracted to the second region 22 by the generated electrostatic attraction force and is held by the second region 22.

The second region 22 may further have a gas line 22g. The gas line 22g is a gas line provided in order to supply a heat transfer gas, for example, a He gas, between the second region 22 and the edge ring ER. The gas line 22g is connected to a gas supply mechanism 90 which is a source of the heat transfer gas.

The second region 22 further has an electrode 22c. The electrode 22c is an electrode having a film shape, and is provided in the dielectric portion 20d in the second region 22. The electrode 22c configures another bias electrode. The electrode 22a and the electrode 22b may extend closer to the upper surface of the second region 22 than the electrodes 22c in the vertical direction.

The plasma processing apparatus 1 is further provided with a direct-current power source 83. The direct-current power source 83 is configured to generate a negative direct-current voltage and apply the negative direct-current voltage to the electrodes 22c. The plasma processing apparatus 1 is further provided with a switch 84 (a third switch). The switch 84 is connected between the direct-current power source 83 and the electrode 22c. The plasma processing apparatus 1 may be further provided with an adjustor 85 and a filter 86. The adjustor 85 and the filter 86 are connected between the direct-current power source 83 and the electrode 22c. The adjustor 85 and the filter 86 may be connected between the switch 84 and the electrode 22c.

As shown in FIG. 2, in an embodiment, the plasma processing apparatus 1 is further provided with a controller MC. The controller MC may be a computer which includes a processor, a storage device, an input device, a display device, and the like. The controller MC controls each part of the plasma processing apparatus 1. Specifically, the controller MC executes a control program stored in the storage device and controls each part of the plasma processing apparatus 1, based on recipe data stored in the storage device. A process designated by the recipe data is executed in the plasma processing apparatus 1 under the control by the controller MC. For example, plasma processing methods of various embodiments to be described later are performed in the plasma processing apparatus 1.

Figure 3:
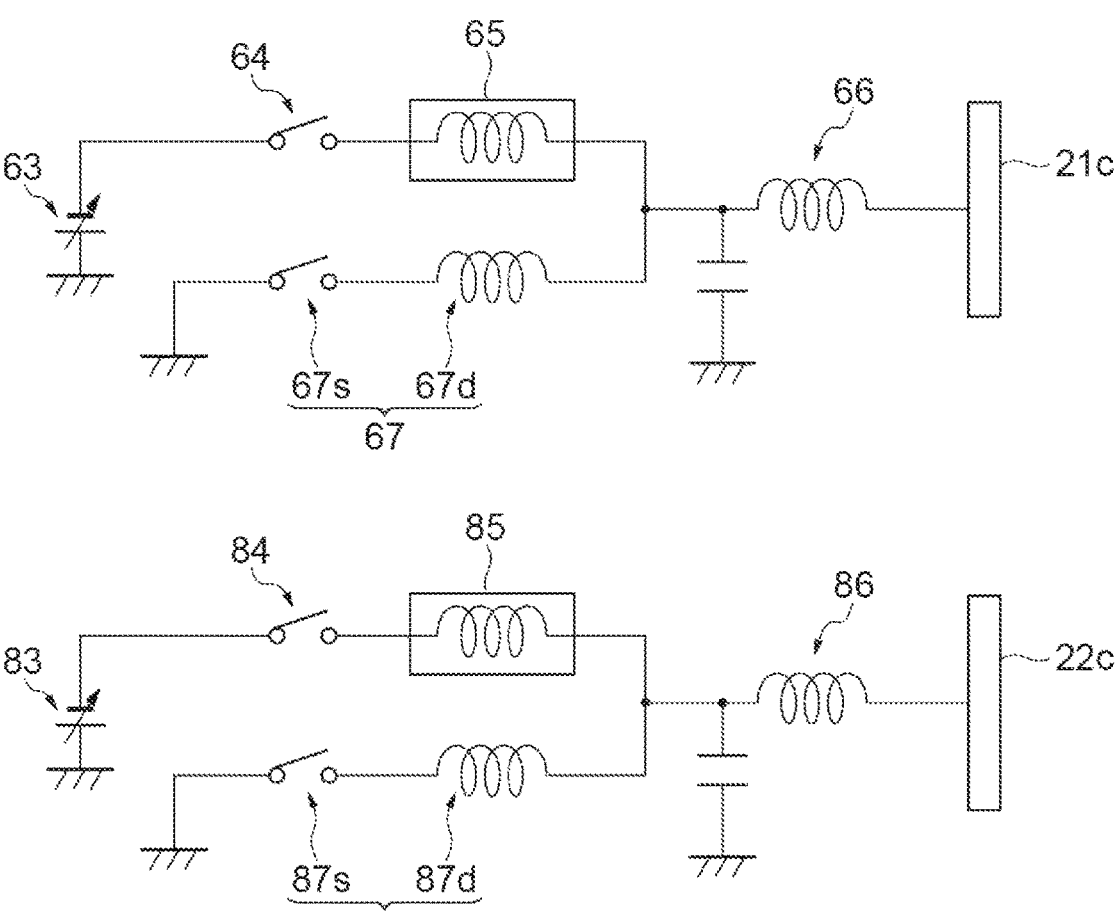
FIG. 3 illustrates an adjustor that can be adopted in the plasma processing apparatus according to an exemplary embodiment.

Hereinafter, FIG. 3 will be referred to. FIG. 3 is a diagram showing an adjustor that can be adopted in the plasma processing apparatus according to an exemplary embodiment. The filter 66 is an electric filter that cuts off or reduces the radio frequency power generated by the radio frequency power source 61. The filter 66 prevents the radio frequency power generated by the radio frequency power source 61 from flowing into the direct-current power source 63, or reduces the radio frequency power flowing into the direct-current power source 63. As shown in FIG. 3, the filter 66 may be an LC filter or another type of filter.

An adjustor 67 includes a switch 67s (a second switch) and a circuit element 67d. The switch 67s and the circuit element 67d are connected in series between the ground and the electrode 21c (or the filter 66). The switch 64 and the switch 67s are controlled by the controller MC to alternately connect the direct-current power source 63 and the ground to the electrode 21c when plasma is being generated in the chamber 10. Therefore, a pulse of a negative direct-current voltage is intermittently applied to the electrode 21c. The pulse of the negative direct-current voltage may be periodically applied to the electrode 21c. A frequency that defines a cycle (time interval) in which the pulse of the negative direct-current voltage is applied to the electrode 21c, that is, a bias cycle, is a frequency of 1 kHz or higher and 27 MHz or lower, for example.

The adjustor 65 is connected between the direct-current power source 63 and the electrode 21c. In an embodiment, the adjustor 65 is connected between the switch 64 and the filter 66. The adjustor 65 is configured to adjust the time (hereinafter, referred to as a "first time") until the potential of the electrode 21c reaches the negative direct-current voltage that is applied by the direct-current power source 63 after the electrode 21c is connected to the direct-current power source 63.

The adjustor 65 includes a circuit element. The circuit element of the adjustor 65 may be an inductor. The circuit element of the adjustor 65 may be a resistor element. In a case where the circuit element of the adjustor 65 is an inductor or a resistor element, the circuit element is connected between the switch 64 and the electrode 21c. Alternatively, the circuit element of the adjustor 65 may be a capacitor. In a case where the circuit element of the adjustor 65 is a capacitor, the circuit element is connected between the ground and a node on the line connecting the switch 64 and the electrode 21c.

The first time may be set to a short time in order to increase the energy of ions that are supplied from the plasma to the substrate W. Therefore, the circuit constant (inductance, a resistance value, or capacitance) of the circuit element of the adjustor 65 may have a value smaller than the circuit constant of the circuit element 67d of the adjustor 67. The adjustor 65 may have a circuit that includes two or more among the inductor, the resistor element, and the capacitor described above.

The adjustor 67 is configured to make the time (hereinafter, referred to as a "second time") until the potential of the electrode 21c reaches the ground potential after the electrode 21c is connected to the ground longer than the first time. Specifically, the circuit element 67d of the adjustor 67 is used in order to extend the second time.

The circuit element 67d may be an inductor. The circuit element 67d may be a resistor element. In a case where the circuit element 67d is an inductor or a resistor element, the circuit element 67d is connected between the switch 67s and the electrode 21c. Alternatively, the circuit element 67d may be a capacitor. In a case where the circuit element 67d is a capacitor, the circuit element 67d is connected between the ground and a node on the line connecting the switch 67s and the electrode 21c. The circuit constant (inductance, a resistance value, or capacitance) of the circuit element 67d is set to a value larger than the circuit constant of the above-described circuit element of the adjustor 65. The adjustor 67 may have a circuit that includes two or more among the inductor, the resistor element, and the capacitor described above, instead of a single circuit element.

The filter 86 is an electric filter that cuts off or reduces the radio frequency power generated by the radio frequency power source 61. The filter 86 prevents the radio frequency power generated by the radio frequency power source 61 from flowing into the direct-current power source 83, or reduces the radio frequency power flowing into the direct-current power source 83. As shown in FIG. 3, the filter 86 may be an LC filter or another type of filter.

An adjustor 87 includes a switch 87s (a fourth switch) and a circuit element 87d. The switch 87s and the circuit element 87d are connected in series between the ground and the electrode 22c (or the filter 86). The switch 84 and the switch 87s are controlled by the controller MC to alternately connect the direct-current power source 83 and the ground to the electrode 22c when plasma is being generated in the chamber 10. Therefore, a pulse of a negative direct-current voltage is intermittently applied to the electrode 22c. The pulse of the negative direct-current voltage may be periodically applied to the electrode 22c. A frequency that defines a cycle (time interval) in which the pulse of the negative direct-current voltage is applied to the electrode 22c is, for example, a frequency of 1 kHz or higher and 27 MHz or lower. The pulse of the negative direct-current voltage that is applied to the electrode 22c may be synchronized with the pulse of the negative direct-current voltage that is applied to the electrode 21c.

The adjustor 85 is connected between the direct-current power source 83 and the electrode 22c. In an embodiment, the adjustor 85 is connected between the switch 84 and the filter 86. The adjustor 85 is configured to adjust the time (hereinafter, referred to as a "third time") until the potential of the electrode 22c reaches the negative direct-current voltage that is applied by the direct-current power source 83 after the electrode 22c is connected to the direct-current power source 83.

The adjustor 85 includes a circuit element. The circuit element of the adjustor 85 may be an inductor. The circuit element of the adjustor 85 may be a resistor element. In a case where the circuit element of the adjustor 85 is an inductor or a resistor element, the circuit element is connected between the switch 84 and the electrode 22c. Alternatively, the circuit element of the adjustor 85 may be a capacitor. In a case where the circuit element of the adjustor 85 is a capacitor, the circuit element is connected between the ground and a node on the line connecting the switch 84 and the electrode 22c.

The circuit constant (inductance, a resistance value, or capacitance) of the circuit element of the adjustor 85 may have a value smaller than the circuit constant of the circuit element 87d of the adjustor 87. The adjustor 85 may have a circuit that includes two or more among the inductor, the resistor element, and the capacitor described above.

The adjustor 87 is configured to make the time (hereinafter, referred to as a "fourth time") until the potential of the electrode 22c reaches the ground potential after the electrode 22c is connected to the ground longer than the third time. Specifically, the circuit element 87d of the adjustor 87 is used in order to extend the fourth time.

The circuit element 87d may be an inductor. The circuit element 87d may be a resistor element. In a case where the circuit element 87d is an inductor or a resistor element, the circuit element 87d is connected between the switch 87s and the electrode 22*c*. Alternatively, the circuit element 87*d* may be a capacitor. In a case where the circuit element 87*d* is a capacitor, the circuit element 87*d* is connected between the ground and a node on the line connecting the switch 87*s* and the electrode 22*c*.

The circuit constant (inductance, a resistance value, or capacitance) of the circuit element 87*d* is set to a value larger than the circuit constant of the above-described circuit element of the adjustor 85. The adjustor 87 may have a circuit that includes two or more among the inductor, the resistor element, and the capacitor described above, instead of a single circuit element.

Figure 4:
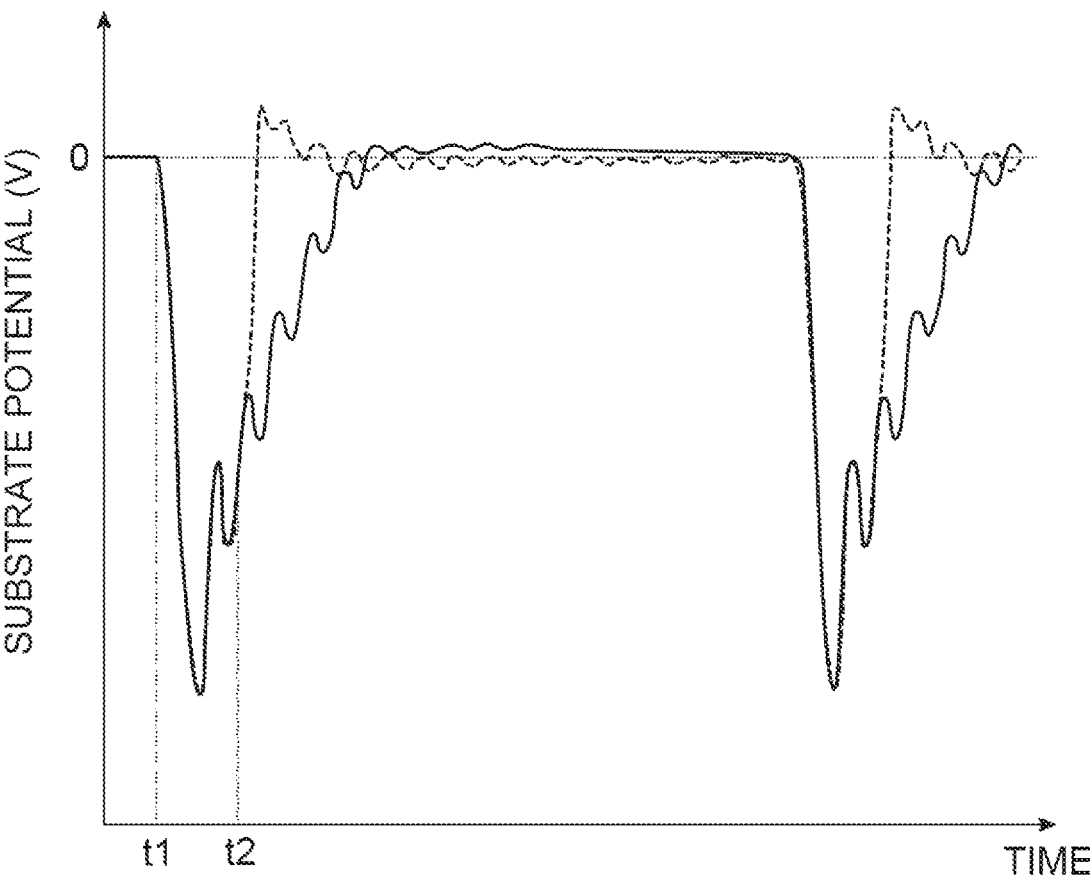
FIG. 4 illustrates an example of a temporal change of the potential of a substrate.

Hereinafter, FIG. 4 will be referred to. FIG. 4 is a diagram showing an example of a temporal change of the potential of the substrate. In FIG. 4, each of the broken line and the solid line shows a temporal change of the potential of the substrate W in a case where the electrode 21*c* is alternately connected to the direct-current power source 63 and the ground in the plasma processing apparatus 1. In FIG. 4, the broken line shows a temporal change of the potential of the substrate W in a case where the circuit constant of the circuit element 67*d* and the circuit constant of the circuit element of the adjustor 65 are the same. In FIG. 4, the solid line shows a temporal change of the potential of the substrate W in a case where the circuit constant of the circuit element 67*d* is larger than the circuit constant of the circuit element of the adjustor 65. In FIG. 4, t1 indicates a point in time when the electrode 21*c* is connected to the direct-current power source 63, and t2 indicates a point in time when the electrode 21*c* is connected to the ground.

In a case where the circuit constant of the circuit element 67*d* is relatively small, that is, in a case where the second time is relatively short, as shown by the dotted line in FIG. 4, the amount of overshoot to the positive side of the potential of the substrate W after the electrode 21*c* is connected to the ground becomes relatively large. Since the potential of the plasma rises following the potential of the substrate, the potential difference between the plasma and the wall of the chamber 10 becomes large in a case where the second time is relatively short. Therefore, in a case where the second time is relatively short, the energy of ions toward the wall of the chamber 10 becomes large. As a result, the wall of the chamber 10 or parts in the vicinity thereof are damaged, and particles are emitted.

On the other hand, in a case where the circuit constant of the circuit element 67*d* is relatively large, that is, in a case where the second time is relatively long, as shown by the solid line in FIG. 4, the amount of overshoot to the positive side of the potential of the substrate W after the electrode 21*c* is connected to the ground is reduced. As a result, a rise in the potential of the plasma after the electrode 21*c* is connected to the ground is suppressed. Similarly, a rise in the potential of the plasma after the electrode 22*c* is connected to the ground is suppressed. Therefore, the potential difference between the plasma and the wall of the chamber 10 is reduced, and thus the energy of ions toward the wall of the chamber 10 is reduced.

Further, in the plasma processing apparatus 1, since the time until the potential of the electrode 21*c* reaches the negative direct-current voltage after the direct-current power source 63 is connected to the electrode 21*c* is short, ions of relatively high energy are supplied to the substrate W.

Figure 5:
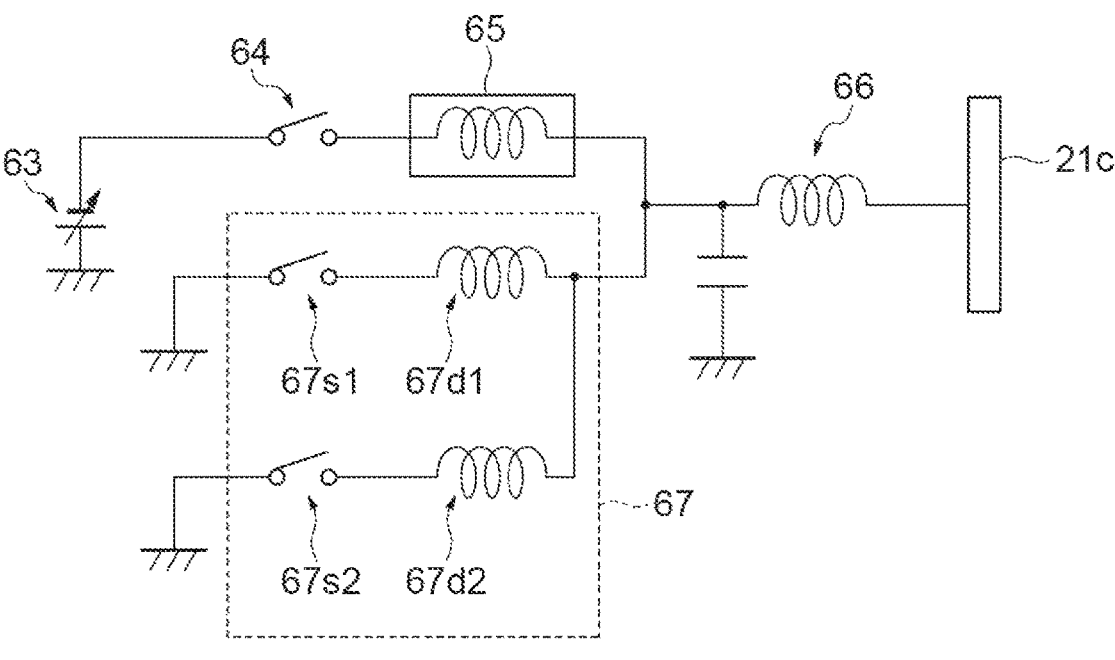
FIG. 5 illustrates an adjustor that can be adopted in the plasma processing apparatus according to an exemplary embodiment.
Figure 5:
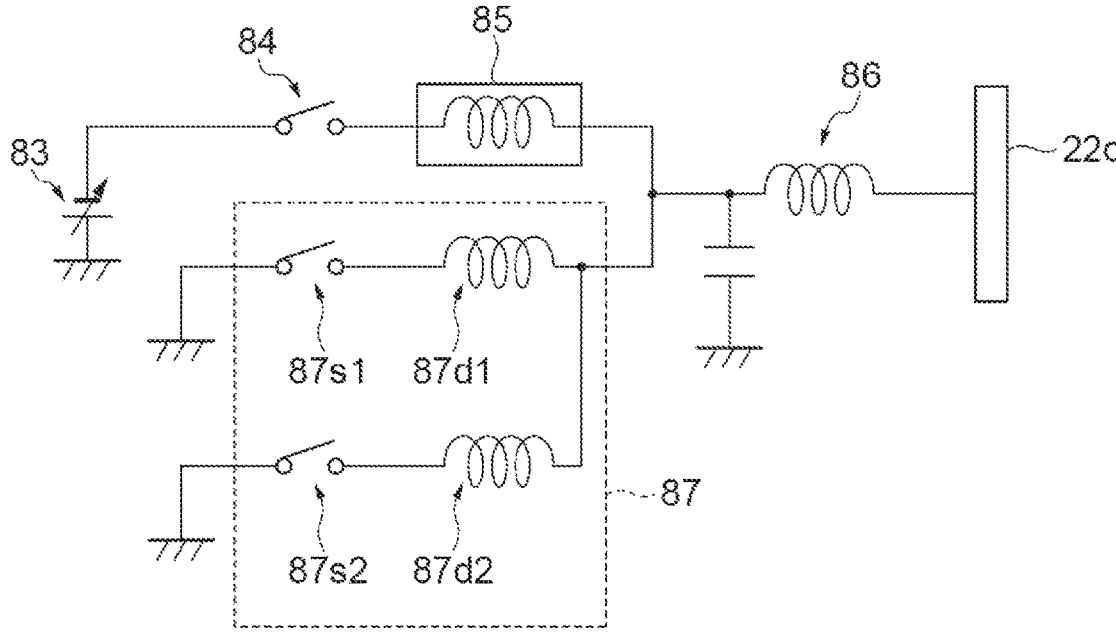

Hereinafter, FIG. 5 will be referred to. FIG. 5 is a diagram showing an adjustor that can be adopted in the plasma processing apparatus according to an exemplary embodiment. The adjustor 67 and the adjustor 87 shown in FIG. 5 can be adopted in the plasma processing apparatus 1.

The adjustor 67 shown in FIG. 5 has a plurality of switches 67*s*1 and 67*s*2 (a plurality of second switches). The plurality of switches 67*s*1 and 67*s*2 are connected in parallel between the ground and the electrode 21*c*. In an embodiment, the plurality of switches 67*s*1 and 67*s*2 are connected in parallel between the filter 66 and the ground.

As shown in FIG. 5, the adjustor 67 may further have a plurality of circuit elements 67*d*1 and 67*d*2. The plurality of circuit elements 67*d*1 and 67*d*2 are connected in series with the plurality of switches 67*s*1 and 67*s*2, respectively. Each of the plurality of circuit elements 67*d*1 and 67*d*2 may be an inductor or may be a resistor element. Each of the plurality of circuit elements 67*d*1 and 67*d*2 is connected between a corresponding switch (switch 67*s*1 or switch 67*s*2) and the electrode 21*c* in a case where it is an inductor or a resistor element. Alternatively, each of the plurality of circuit elements 67*d*1 and 67*d*2 may be a capacitor. Each of the plurality of circuit elements 67*d*1 and 67*d*2 is connected between the ground and a node on the line connecting a corresponding switch (switch 67*s*1 or switch 67*s*2) and the electrode 21*c*, in a case where it is a capacitor.

The circuit constant of each of the plurality of circuit elements 67*d*1 and 67*d*2 may be the same as the circuit constant of the circuit element of the adjustor 65, or may be larger than the circuit constant of the circuit element of the adjustor 65. Each of the number of the plurality of switches and the number of the plurality of circuit elements of the adjustor 67 may be more than two. Further, the adjustor 67 may have a circuit that includes two or more among the inductor, the resistor element, and the capacitor described above, instead of a single circuit element 67*d*1. Further, the adjustor 67 may have a circuit that includes two or more among the inductor, the resistor element, and the capacitor described above, instead of a single circuit element 67*d*2.

Even in a case where the adjustor 67 shown in FIG. 5 is used, the controller MC controls the switch 64 and the plurality of switches 67*s*1 and 67*s*2 to alternately connect the direct-current power source 63 and the ground to the electrode 21*c* when plasma is being generated in the chamber 10. In a case where the adjustor 67 shown in FIG. 5 is used, the controller MC controls the plurality of switches 67*s*1 and 67*s*2 to intermittently connect the electrode 21*c* to the ground until the potential of the electrode 21*c* reaches the ground potential after the electrode 21*c* is connected to the ground. In an embodiment, the controller MC controls the plurality of switches 67*s*1 and 67*s*2 to intermittently and sequentially close the plurality of switches 67*s*1 and 67*s*2 until the potential of the electrode 21*c* reaches the ground potential after the electrode 21*c* is connected to the ground.

The adjustor 87 shown in FIG. 5 has a plurality of switches 87*s*1 and 87*s*2. The plurality of switches 87*s*1 and 87*s*2 are connected in parallel between the ground and the electrode 22*c*. In an embodiment, the plurality of switches 87*s*1 and 87*s*2 are connected in parallel between the filter 86 and the ground.

As shown in FIG. 5, the adjustor 87 may further have a plurality of circuit elements 87*d*1 and 87*d*2. The plurality of circuit elements 87*d*1 and 87*d*2 are connected in series with the plurality of switches 87*s*1 and 87*s*2, respectively. Each of the plurality of circuit elements 87*d*1 and 87*d*2 may be an inductor or may be a resistor element. Each of the plurality of circuit elements 87*d*1 and 87*d*2 is connected between a corresponding switch (switch 87*s*1 or switch 87*s*2) and the electrode 22*c* in a case where it is an inductor or a resistor element. Alternatively, each of the plurality of circuit elements 87*d*1 and 87*d*2 may be a capacitor. Each of the plurality of circuit elements 87*d*1 and 87*d*2 is connected between the ground and a node on the line connecting a corresponding switch (switch 87s1 or switch 87s2) and the electrode 22c, in a case where it is a capacitor.

The circuit constant of each of the plurality of circuit elements 87d1 and 87d2 may be the same as the circuit constant of the circuit element of the adjustor 85, or may be larger than the circuit constant of the circuit element of the adjustor 85. Each of the number of the plurality of switches and the number of the plurality of circuit elements of the adjustor 87 may be more than two. Further, the adjustor 87 may have a circuit that includes two or more among the inductor, the resistor element, and the capacitor described above, instead of a single circuit element 87d1. Further, the adjustor 87 may have a circuit that includes two or more among the inductor, the resistor element, and the capacitor described above, instead of a single circuit element 87d2.

Even in a case where the adjustor 87 shown in FIG. 5 is used, the controller MC controls the switch 84 and the plurality of switches 87s1 and 87s2 to alternately connect the direct-current power source 83 and the ground to the electrode 22c when plasma is being generated in the chamber 10. In a case where the adjustor 87 shown in FIG. 5 is used, the controller MC controls the plurality of switches 87s1 and 87s2 to intermittently connect the electrode 22c to the ground until the potential of the electrode 22c reaches the ground potential after the electrode 22c is connected to the ground. In an embodiment, the controller MC controls the plurality of switches 87s1 and 87s2 to intermittently and sequentially close the plurality of switches 87s1 and 87s2 until the potential of the electrode 22c reaches the ground potential after the electrode 22c is connected to the ground.

Even in a case where the adjustor 67 shown in FIG. 5 is used, the time until the potential of the electrode 21c reaches the ground potential after the electrode 21c is connected to the ground becomes long. Therefore, the amount of overshoot to the positive side of the potential of the substrate W after the electrode 21c is connected to the ground is reduced. As a result, a rise in the potential of the plasma after the electrode 21c is connected to the ground is suppressed. Similarly, a rise in the potential of the plasma after the electrode 22c is connected to the ground is suppressed. Therefore, the potential difference between the potential of the plasma and the wall of the chamber 10 is reduced, and thus the energy of ions toward the wall of the chamber 10 is reduced.

The adjustor 67 may have a single switch instead of the plurality of switches 67s1 and 67s2. The controller MC may control the single switch to intermittently close the single switch until the potential of the electrode 21c reaches the ground potential after the electrode 21c is connected to the ground. Further, the adjustor 87 may have a single switch instead of the plurality of switches 87s1 and 87s2. The controller MC may control the single switch to intermittently close the single switch until the potential of the electrode 22c reaches the ground potential after the electrode 22c is connected to the ground.

Figure 6:
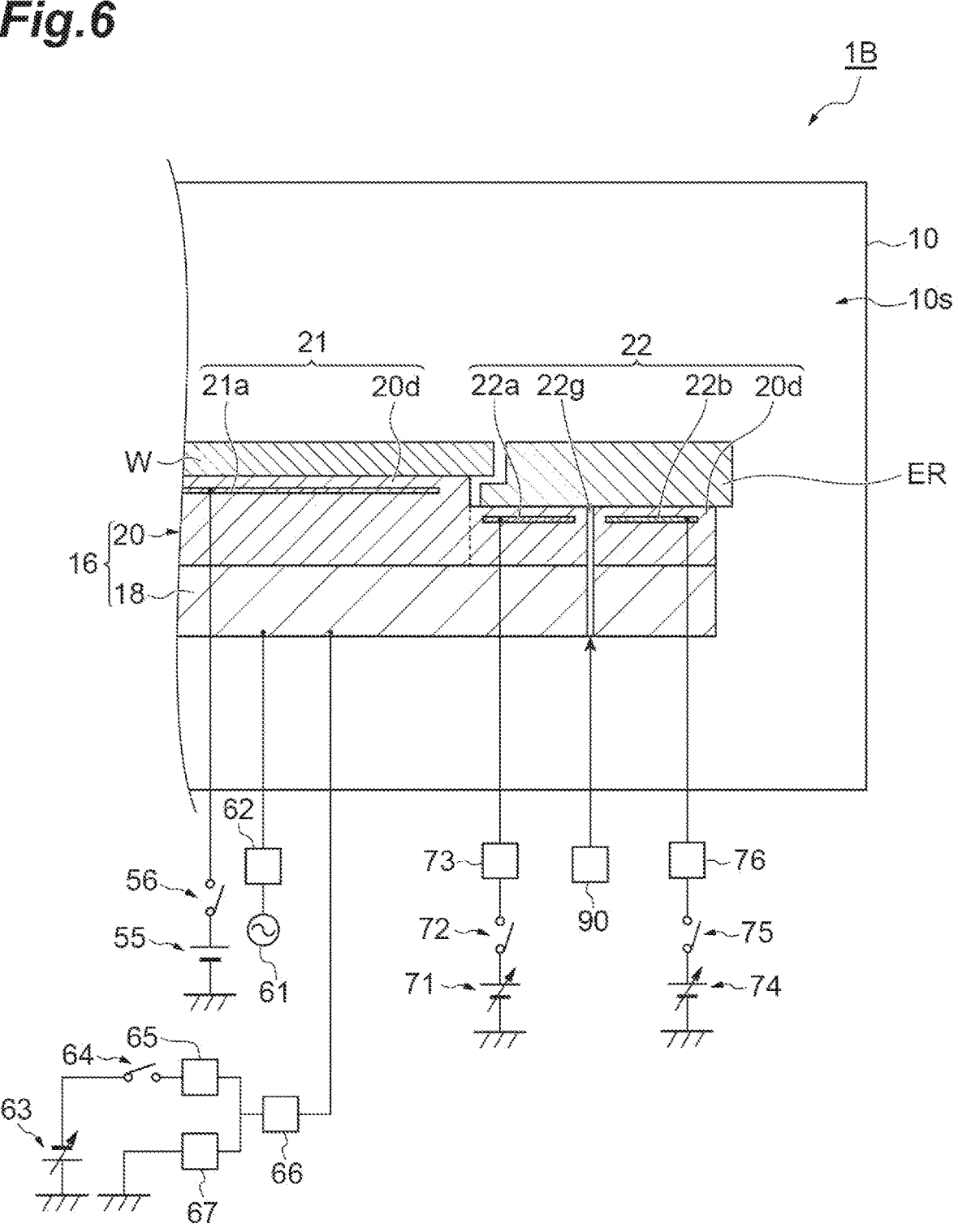
FIG. 6 schematically illustrates a plasma processing apparatus according to another exemplary embodiment.

Hereinafter, FIG. 6 will be referred to. FIG. 6 is a diagram schematically showing a plasma processing apparatus according to another exemplary embodiment. A plasma processing apparatus 1B shown in FIG. 6 is not provided with the direct-current power source 83, the switch 84, the adjustor 85, the filter 86, and the adjustor 87. In the plasma processing apparatus 1B, the base 18 configures a bias electrode. That is, the direct-current power source 63 is connected to the base 18 through the switch 64, the adjustor 65, and the filter 66. The base 18 is connected to the ground through the filter 66 and the adjustor 67. Other configurations of the plasma processing apparatus 1B may be the same as the corresponding configurations of the plasma processing apparatus 1.

Figure 7:
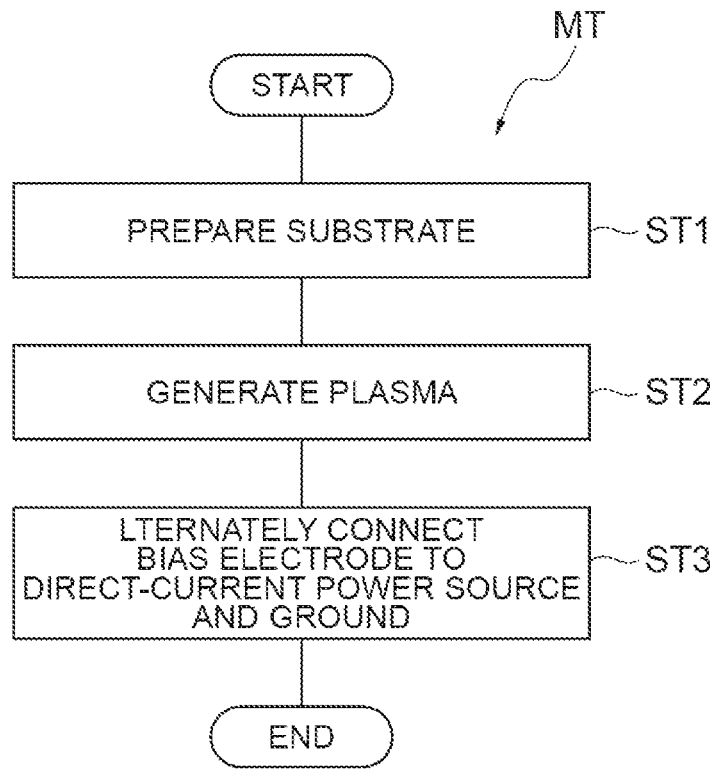
FIG. 7 is a flow chart of a plasma processing method according to an exemplary embodiment.

Hereinafter, FIG. 7 will be referred to. FIG. 7 is a flow chart of a plasma processing method according to an exemplary embodiment. The plasma processing method (hereinafter referred to as a "method MT") shown in FIG. 7 may be performed using the plasma processing apparatus 1 or 1B.

In step ST1 of the method MT, a substrate is prepared on the substrate support of the plasma processing apparatus. In a case where the plasma processing apparatus 1 or 1B is used, the substrate W is placed on the substrate support 16. The substrate W may be held by the electrostatic chuck 20.

In step ST2, plasma is generated from a gas in the chamber. In a case where the plasma processing apparatus 1 or 1B is used, the gas from the gas supply unit is supplied into the chamber 10, the pressure in the chamber 10 is reduced by the exhaust device 50, and radio frequency power is supplied from the radio frequency power source 61.

Step ST3 is performed when plasma is being generated in the chamber. In step ST3, a bias electrode of the substrate support is alternately connected to the direct-current power source and the ground. In a case where the plasma processing apparatus 1 is used, the electrode 21c is alternately connected to the direct-current power source 63 and the ground, and the electrode 22c is alternately connected to the direct-current power source 83 and the ground. In a case where the plasma processing apparatus 1B is used, the base 18 is alternately connected to the direct-current power source 63 and the ground.

In step ST3, the time until the potential of the bias electrode reaches the ground potential after the bias electrode is connected to the ground is longer than the time until the potential of the bias electrode reaches a negative direct-current voltage after a direct-current power source is connected to the bias electrode. In a case where the plasma processing apparatus 1 or 1B is used, the time until the potential of the electrode 21c or the base 18 reaches the ground potential after the electrode 21c or the base 18 is connected to the ground is longer than the time until the potential of the electrode 21c or the base 18 reaches the negative direct-current voltage after the direct-current power source 63 is connected to the electrode 21c or the base 18. Therefore, in the plasma processing apparatus 1 or 1B, the adjustor 67 is adopted. Further, in a case where the plasma processing apparatus 1 is used, the time until the potential of the electrode 22c reaches the ground potential after the electrode 22c is connected to the ground is longer than the time until the potential of the electrode 22c reaches the negative direct-current voltage after the direct-current power source 83 is connected to the electrode 22c. Therefore, in the plasma processing apparatus 1, the adjustor 87 is adopted.

While various exemplary embodiments have been described above, various additions, omissions, substitutions and changes may be made without being limited to the exemplary embodiments described above. Elements of the different embodiments may be combined to form another embodiment.

For example, in another embodiment, the plasma processing apparatus may be a capacitively coupled plasma processing apparatus other than the plasma processing apparatus 1 and the plasma processing apparatus 1B. In still another embodiment, the plasma processing apparatus may be another type of plasma processing apparatus other than the capacitively coupled type. Such a plasma processing apparatus may be an inductively coupled plasma processing apparatus, an electron cyclotron resonance (ECR) plasma processing apparatus, or a plasma processing apparatus that generates plasma by surface waves such as microwaves.

Further, the plasma processing apparatus 1 does not need to be provided with the circuit element 67d, and the switch 67s may be connected to the electrode 21c through the circuit element of the adjustor 65. The plasma processing apparatus 1 does not need to be provided with the circuit element 87d, and the switch 87s may be connected to the electrode 22c through the circuit element of the adjustor 85.

The switch 64, the adjustor 65, and the adjustor 67 may be included in the direct-current power source 63. Further, the switch 84, the adjustor 85, and the adjustor 87 may be included in the direct-current power source 83. Further, each of the direct-current power source 63 and the direct-current power source 83 may be configured to generate a waveform of the same low power, amplify the generated waveform by an amplifier, and apply the amplified waveform to a corresponding electrode. The waveform that is generated by each of the direct-current power source 63 and the direct-current power source 83 may be a sawtooth waveform, a triangular waveform, or an impulse waveform, instead of a square wave. Each of the direct-current power source 63 and the direct-current power source 83 may be an impulse power source which applies a negative voltage.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber;
a plasma generator configured to generate plasma from a gas in the chamber;
a substrate support having a bias electrode and provided in the chamber;
a direct-current power source configured to generate a negative direct-current voltage;
a first switch connected between the direct-current power source and the bias electrode;
an adjustor having at least one second switch connected between a ground and the bias electrode; and
a controller configured to control the first switch and the at least one second switch to alternately connect the direct-current power source and the ground to the bias electrode,
wherein the adjustor is configured to make a time until a potential of the bias electrode reaches a ground potential after the bias electrode is connected to the ground longer than a time until the potential of the bias electrode reaches the negative direct-current voltage after the direct-current power source is connected to the bias electrode.

2. The plasma processing apparatus according to claim 1, wherein the adjustor further has a circuit element connected between the bias electrode and the ground, the circuit element extending the time until the potential of the bias electrode reaches the ground potential after the bias electrode is connected to the ground.

3. The plasma processing apparatus according to claim 2, wherein the circuit element includes an inductor, a resistor, or a capacitor.

4. The plasma processing apparatus according to claim 2, further comprising:

an other circuit element connected between the direct-current power source and the bias electrode,
wherein a circuit constant of the circuit element of the adjustor is larger than a circuit constant of the other circuit element.

5. The plasma processing apparatus according to claim 4, wherein the other circuit element includes an inductor, a resistor, or a capacitor.

6. The plasma processing apparatus according to claim 1, wherein the controller is configured to control the at least one second switch to intermittently connect the bias electrode to the ground until the potential of the bias electrode reaches the ground potential after the bias electrode is connected to the ground.

7. The plasma processing apparatus according to claim 6, wherein the adjustor has a plurality of second switches connected in parallel between the ground and the bias electrode, as the at least one second switch, and
the controller is configured to intermittently and sequentially close the plurality of second switches until the potential of the bias electrode reaches the ground potential after the bias electrode is connected to the ground.

8. The plasma processing apparatus according to claim 7, wherein the adjustor further includes a plurality of circuit elements,
each of the plurality of circuit elements is connected between a corresponding one among the plurality of second switches and the bias electrode,
the adjustor further includes an other circuit element connected between the direct-current power source and the bias electrode, and
wherein a circuit constant of each of the plurality of circuit elements is same as a circuit constant of the other circuit element.

9. The plasma processing apparatus according to claim 7, wherein the adjustor further includes a plurality of circuit elements,
each of the plurality of circuit elements is connected between a corresponding one among the plurality of second switches and the bias electrode,
the adjustor further includes an other circuit element connected between the direct-current power source and the bias electrode, and
wherein a circuit constant of each of the plurality of circuit elements is different from a circuit constant of the other circuit element.

10. The plasma processing apparatus according to claim 1,
wherein the substrate support further has a dielectric portion formed of a dielectric, and
the bias electrode is provided in the dielectric portion.

11. The plasma processing apparatus according to claim 10, wherein the dielectric portion configures an electrostatic chuck.

12. The plasma processing apparatus according to claim 10,
wherein the substrate support has a first region on which a substrate is placed, and a second region on which an edge ring is placed,
the bias electrode is provided in the dielectric portion in the first region,
the substrate support further has an other bias electrode which is provided in the dielectric portion in the second region,
the plasma processing apparatus further comprises an other direct-current power source configured to generate a negative direct-current voltage, a third switch connected between the other direct-current power source and the other bias electrode, and an other adjustor having at least one fourth switch connected between the ground and the other bias electrode, the controller is configured to control the third switch and the at least one fourth switch to alternately connect the other direct-current power source and the ground to the other bias electrode, and the other adjustor is configured to make a time until a potential of the other bias electrode reaches the ground potential after the other bias electrode is connected to the ground longer than a time until the potential of the other bias electrode reaches the negative direct-current voltage after the other direct-current power source is connected to the other bias electrode.

13. The plasma processing apparatus according to claim 1, wherein the substrate support has a lower electrode which is the bias electrode, and an electrostatic chuck provided on the lower electrode.

14. A plasma processing method comprising:

(a) preparing a substrate on a substrate support in a chamber of a plasma processing apparatus;

(b) generating plasma in the chamber; and (c) alternately connecting a bias electrode of the substrate support to a direct-current power source and a ground, the direct-current power source being configured to generate a negative direct-current voltage, wherein in said (c), a time until a potential of the bias electrode reaches a ground potential after the bias electrode is connected to the ground is set to be longer than a time until the potential of the bias electrode reaches the negative direct-current voltage after the direct-current power source is connected to the bias electrode.

\* \* \* \* \*